United States Patent
Tian et al.

(10) Patent No.: US 11,860,127 B2
(45) Date of Patent: Jan. 2, 2024

(54) EDDY CURRENT PROBE BASED ON HALBACH ARRAY COIL

(71) Applicants: China Oil & Gas Pipeline Network Corporation, Beijing (CN); South China Company, China Oil & Gas Pipeline Network Corporation, Guangzhou (CN)

(72) Inventors: Zhongshan Tian, Beijing (CN); Xianzhong Wang, Guangzhou (CN); Lin Yi, Guangzhou (CN); Changqun Yang, Guangzhou (CN); Daodong Niu, Guangzhou (CN); Jiaming Liang, Guangzhou (CN)

(73) Assignees: CHINA OIL & GAS PIPELINE NETWORK CORPORATION, Beijing (CN); SOUTH CHINA COMPANY, CHINA OIL & GAS PIPELINE NETWORK CORPORATION, Guangzhou (CN)

( * ) Notice: Subject to any disclaimer, the term of this patent is extended or adjusted under 35 U.S.C. 154(b) by 0 days.

(21) Appl. No.: 17/705,452

(22) Filed: Mar. 28, 2022

(65) Prior Publication Data
US 2022/0214309 A1   Jul. 7, 2022

(30) Foreign Application Priority Data
Sep. 9, 2021   (CN) .......................... 202111056515.X

(51) Int. Cl.
*G01N 27/90*  (2021.01)
*G01R 1/067*  (2006.01)
*H01F 7/20*  (2006.01)

(52) U.S. Cl.
CPC ......... *G01N 27/9006* (2013.01); *G01R 1/067* (2013.01); *H01F 7/20* (2013.01)

(58) Field of Classification Search
CPC .. G01N 27/87–9093; G01R 1/067; H01F 7/20
USPC .................................................. 324/228–243
See application file for complete search history.

(56) References Cited

U.S. PATENT DOCUMENTS 7,598,646 B2 * 10/2009 Cleveland .............. H02K 21/24
                                                      310/156.43
2018/0217097 A1 *  8/2018 Tada .................... G01N 27/902

FOREIGN PATENT DOCUMENTS

CN        112347598 A  *  2/2021 ............. G01N 27/90

OTHER PUBLICATIONS

Deng et al.; Translation of CN-112347598-A; Feb. 9, 2021; Translated by Clarivate Analytics (Year: 2021).*

* cited by examiner

*Primary Examiner* — Steven L Yeninas
*Assistant Examiner* — Rahul Maini
(74) *Attorney, Agent, or Firm* — IPRO, PLLC

(57) ABSTRACT

An eddy current probe based on a Halbach array coil includes a first coil, a second coil, a third coil, a fourth coil and a fifth coil arranged in a form of a Halbach array. One side with dense magnetic induction lines is used as a displacement measurement direction of the eddy current probe.

2 Claims, 1 Drawing Sheet

EDDY CURRENT PROBE BASED ON HALBACH ARRAY COIL

TECHNICAL FIELD

The present disclosure relates to the technical field of eddy current sensors, in particular to an eddy current probe based on a Halbach array coil.

BACKGROUND

Based on the principle of an eddy current mutual inductance effect with a conductive medium, an eddy current sensor can achieve high-precision measurement of internal defects and a micro displacement of a measured object, and is characterized by good long-term operation reliability, high sensitivity, high antijamming capability, non-contact measurement, fast response, and impregnability by media such as oil and water. Therefore, the eddy current sensor is widely used in the fields of non-destructive testing of metal equipment, high-precision measurement, and the like.

However, due to technical bottlenecks such as a coil structure and parameter optimization, the existing eddy current sensors have defects such as poor sensitivity, low linearity, and urgent need of improving the detection precision in a sudden-change temperature field, so that the application of the eddy current sensors in the field of high-precision detection under an extreme environment. Therefore, improving the sensitivity and detection precision of the eddy current sensor has become the key to solve the problem.

As a core component of the eddy current sensor, a coil is mainly used for generating a magnetic field that excites an eddy current in a measured medium and converting a measured physical quantity into an impedance electrical signal through magnetic field energy coupling with the measured medium. The structural form of the coil and the nature of impedance parameters determine the spatial distribution characteristics of a detection magnetic field, and the spatial distribution characteristics directly affect the sensitivity and detection precision of the eddy current sensor.

At present, common coil structures are mainly divided into a typical planar single coil, spatial multiple coils, an orthogonal rectangular cylindrical coil, and an unconventional flexible coil. Due to significant differences in the spatial magnetic field distribution characteristics of various types of coils, there are also obvious differences in their applicable fields. It is common that the intensity of a magnetic field generated by a coil is not high enough. In the final analysis, magnetic induction line cannot be well concentrated, directly affecting the sensitivity and detection precision of the eddy current sensor.

SUMMARY

For the deficiencies of an existing coil structure, the present disclosure provides an eddy current probe based on a Halbach array coil. The present disclosure provides the following technical solution:

An eddy current probe based on a Halbach array coil includes a first coil, a second coil, a third coil, a fourth coil, and a fifth coil;

the first coil, the third coil, and the fifth coil are horizontally placed; the second coil and the fourth coil are vertically placed; a current is made to one end of the first coil to generate a magnetic field; a current is made to one end of the second coil to generate a magnetic field; a current is made to the other end of the third coil to generate a magnetic field; a current is made to different terminals of the fourth coil to generate a magnetic field; a current same as the current made to the first coil is made to the fifth coil to generate a magnetic field; and one side with dense magnetic induction lines is used as a displacement measurement direction of the eddy current probe.

Preferably, winding directions of the first coil, the second coil, the third coil, the fourth coil, and the fifth coil are the same.

Preferably, a displacement of a measured conductor is related to an equivalent impedance of a detection coil; the equivalent impedance Z of the detection coil is related to a geometric parameter of the coil, a frequency f of an exciting signal and a displacement x of the measured conductor and is related to an electrical conductivity σ and a magnetic conductivity μ of the measured conductor; and the equivalent impedance of the detection coil is expressed by the following formula:

$$Z = f(R_b, R_a, h, N, f, x, \sigma, \mu)$$

where $R_b$ is an external radius of the coil; $R_a$ is an internal radius of the coil; h is a thickness of the coil; and N is the number of turns of the coil.

The present disclosure has the following beneficial effects:

The present disclosure provides the eddy current probe design based on the Halbach array coil. On the basis of parallel cylindrical single coils, a coil arrangement in the form of a Halbach array is creatively adopted; by means of arranging permanent magnets in different magnetizing directions according to a certain rule, magnetic lines can be gathered on one side of the magnets, and magnetic lines can be weakened on the other side, so as to obtain an ideal single-sided magnetic field, so that the magnetic field of one side is obviously enhanced; a stronger eddy current effect can be generated; and the measurement precision of the micro displacement and the resolution can be improved.

DETAILED DESCRIPTION

The present disclosure is described in detail below in combination with specific examples.

Specific Example I

Figure 1:
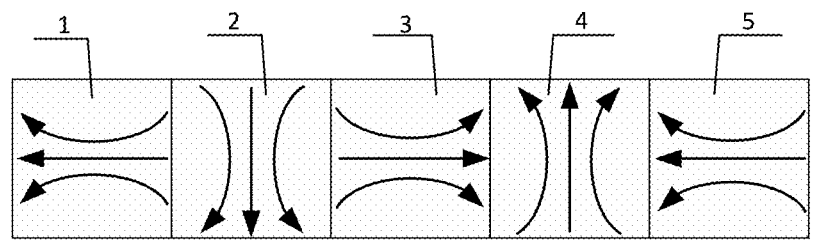
FIG. 1 is a placement diagram of an array coil.
Figure 2:
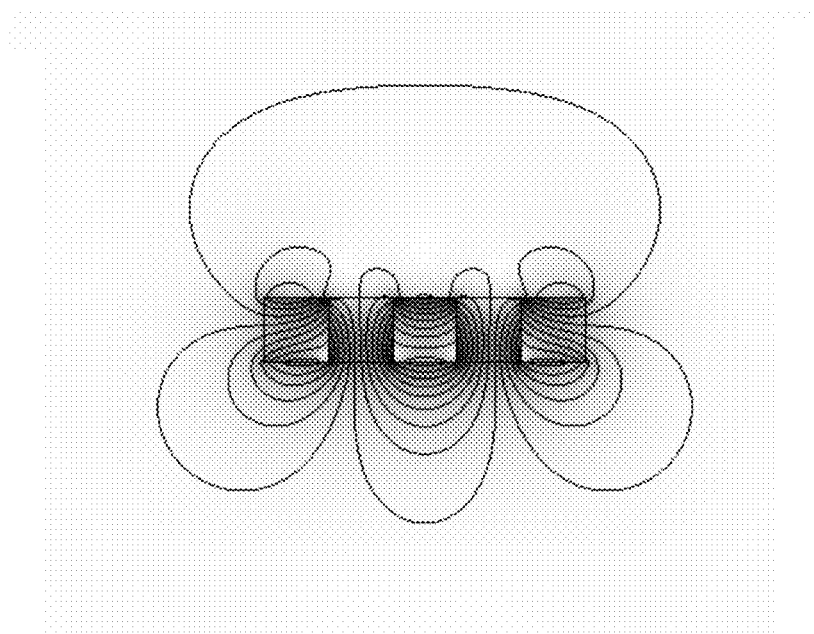
FIG. 2 is a simulation diagram of a magnetic field of a Halbach array coil.

According to FIG. 1 to FIG. 2, the present disclosure provides an eddy current probe based on a Halbach array coil. The present disclosure proposes an eddy current probe based on a Halbach array coil. For the deficiencies of an existing coil structure, the present disclosure provides an eddy current probe design based on a Halbach array coil in the field of high-precision measurement of a micro displacement. On the basis of parallel cylindrical single coils, a coil arrangement in the form of a Halbach array is creatively adopted; by means of arranging permanent magnets in different magnetizing directions according to a certain rule, magnetic lines can be gathered on one side of the magnets, and magnetic lines can be weakened on the other side, so as to obtain an ideal single-sided magnetic field, so that the magnetic field of one side is obviously enhanced; a stronger eddy current effect can be generated; and the measurement precision of the micro displacement and the resolution can be improved.

The technical solution adopted by the present disclosure is an eddy current probe design based on a Halbach array coil, and the design is characterized in that firstly, coils are arranged according to a direction of a single-sided magnetic field to be obtained (namely, a displacement measurement direction of a eddy current sensor), as shown in FIG. 1. 5 coils with the same winding directions are arranged, as shown in the figure. A first coil 1, a third coil 3 and a fifth coil 5 are horizontally placed; a second coil 2 and a fourth coil 4 are vertically placed; currents are made to different terminals (a current is made to different terminals of the first coil 1 and the third coil 3; a current is made to different terminals of the second coil 2 and the fourth coil 4; and a current is made to the same terminals of the first coil 1 and the fifth coil 5); and a magnetic field in a direction as shown in the figures is generated according to the Faraday's theorem of electromagnetic induction.

This coil placement method will generate a strong magnetic field on the lower side (the displacement measurement direction) of the figure, and a simulation result of the magnetic field is as shown in FIG. 2. The magnetic field on one side in this arrangement method will be obviously enhanced and can be used as a measurement end of the eddy current probe. The magnetic field intensity enhanced by means of the coil design can generate enhanced eddy current induction inside a measured conductor, thereby improving the measurement precision and resolution of the eddy current sensor.

The present disclosure mainly has the advantages that the eddy current probe based on the Halbach array coil used for enhancing the intensity of the magnetic field in the displacement measurement direction is designed; a coil will generate a magnetic field when a current is made to the coil, and the direction of the magnetic field corresponds to a magnet polarization direction of a Halbach array; and the coil is correspondingly placed to achieve an effect of the Halbach array. By means of the designed structure of this coil, the intensity of the magnetic field in the displacement measurement direction can be enhanced, so that the intensity of the magnetic field can be maximized by the smallest number of coils; and the number of magnetic fields on the other side is smaller, so that the influence caused by this side during measurement of a micro displacement can be reduced.

By adopting the above-mentioned structural design, the intensity of the magnetic field in the displacement measurement direction is greatly enhanced. In the measurement process, the magnetic field will induce a stronger eddy current effect inside the measured conductor, greatly improving the measurement precision and resolution of the eddy current sensor.

As shown in FIG. 2, one side with dense magnetic induction lines is used as the displacement measurement direction of the eddy current probe. The eddy current probe is fixed. When the measured conductor moves towards or away from the probe, an eddy current effect may be caused inside the measured conductor. The intensity of the eddy current effect is related to the intensity of the magnetic field at this place. When the measured conductor moves towards the probe, the intensity of the magnetic field increases, and the eddy current effect is enhanced. When the measured conductor moves away from the probe, the intensity of the magnetic field is relatively low, and the eddy current effect is weakened. Since an eddy current is an alternating current, the eddy current may generate an induced magnetic field. The direction of the induced magnetic field is opposite to the direction of the original magnetic field according to the Lenz's law, so as to weaken the original magnetic field of the coil. The size of the induced magnetic field is affected by the size of the eddy current. A displacement of a measured metal object and internal defects may affect the size of the eddy current, thereby affecting the size of the induced magnetic field, and this finally causes the impedance of the coil to change.

According to the principle of the eddy current, a displacement of the measured conductor is related to an equivalent impedance of a detection coil; the equivalent impedance Z of the detection coil is related to a geometric parameter of the coil, a frequency f of an exciting signal and a displacement x of the measured conductor and is related to an electrical conductivity σ and a magnetic conductivity μ of the measured conductor; and therefore, the equivalent impedance of the detection coil may be written as:

$$Z=f(R_b,R_a,h,N,f,x,\sigma,\mu)$$

where $R_b$ is an external radius of the coil; $R_a$ is an internal radius of the coil; h is a thickness of the coil; and N is the number of turns of the coil.

According to the above formula, if the geometric parameter of the coil and the frequency of the exciting signal are fixed, and the electrical conductivity and magnetic conductivity of the measured conductor are also kept unchanged, the equivalent impedance of the coil is only related to the displacement of the measured conductor. The control variate method is used to fix all the parameters except for the displacement of the measured conductor; and a signal conditioning system of the sensor is designed by using a relation that the displacement of the measured conductor and the equivalent impedance of the coil are univalent functions, so as to complete the design of an eddy current displacement sensor.

The above is only a preferable implementation of the eddy current probe based on the Halbach array coil, and the protection scope of the eddy current probe based on the Halbach array coil is not limited to the above example. All technical solutions under this idea fall within the protection scope of the present disclosure. It should be pointed out that for those skilled in the art, several improvements and changes made without departing from the principle of the present disclosure shall also be regarded as the protection scope of the present disclosure.

What is claimed is:

1. An eddy current probe based on a Halbach array coil, wherein the probe comprises a first coil, a second coil, a third coil, a fourth coil, and a fifth coil;
   wherein the first coil, the third coil, and the fifth coil are horizontally placed;
   the second coil and the fourth coil are vertically placed;
   a first current is introduced in the first coil to generate a first magnetic field;
   a second current is introduced in the second coil to generate a second magnetic field;
   a third current in a direction opposite to the first current is introduced in the third coil to generate a third magnetic field;
   a fourth current in a direction opposite to the second current is introduced in the fourth coil to generate a fourth magnetic field;

a fifth current in the same direction as the first current is introduced in the fifth coil to generate a fifth magnetic field; and wherein the eddy current probe is configured to detect a displacement of a conductor based on a change of an impedance of at least one of the first coil, the second coil, the third coil, the fourth coil, and the fifth coil.

2. The eddy current probe based on the Halbach array coil according to claim 1, wherein winding directions of the first coil, the second coil, the third coil, the fourth coil, and the fifth coil are the same.

\* \* \* \* \*